(12) United States Patent
Lee et al.

(10) Patent No.: US 7,429,200 B2
(45) Date of Patent: Sep. 30, 2008

(54) ELECTRICAL CONNECTOR

(75) Inventors: Genn-Sheng Lee, Tu-Cheng (TW); Chi-Nan Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 107 days.

(21) Appl. No.: 11/487,937

(22) Filed: Jul. 17, 2006

(65) Prior Publication Data
US 2007/0015377 A1   Jan. 18, 2007

(30) Foreign Application Priority Data
Jul. 15, 2005   (TW) .............................. 94124098 A

(51) Int. Cl.
*H01R 12/00* (2006.01)
(52) U.S. Cl. ...................................... 439/862
(58) Field of Classification Search ................ 439/66, 439/591, 863, 733.1
See application file for complete search history.

(56) References Cited

U.S. PATENT DOCUMENTS

| | | | | |
|---|---|---|---|---|
| 3,865,458 A * | 2/1975 | Pauza et al. ................. 439/345 |
| 5,879,168 A * | 3/1999 | Chan et al. .................... 439/66 |
| 5,997,315 A * | 12/1999 | Akama et al. ................. 439/66 |
| 6,443,752 B1 * | 9/2002 | Kosawa ...................... 439/342 |
| 6,464,547 B2 * | 10/2002 | Ketelsleger ................. 439/851 |
| 6,561,817 B1 * | 5/2003 | Ma ............................. 439/66 |
| 6,652,329 B1 | 11/2003 | Howell et al. |
| 6,688,893 B1 * | 2/2004 | Huang et al. .................. 439/66 |
| 6,805,561 B1 | 10/2004 | Walkup et al. |
| 6,887,114 B2 | 5/2005 | Liao |
| 6,955,572 B1 | 10/2005 | Howell |
| 2003/0186576 A1 * | 10/2003 | Lin ............................ 439/342 |

* cited by examiner

*Primary Examiner*—Briggitte R. Hammond
(74) *Attorney, Agent, or Firm*—Wei Te Chung

(57) ABSTRACT

According to one embodiment of the present invention, an electrical connector (10) includes an insulative housing (15) defining a number of passages (18) and a number of conductive terminals (20) seated in corresponding passages, respectively. The conductive terminal includes a base section (22), a bent section (23) projecting angularly from the base section and having a planar section (26) parallel with the base section, a spring arm (24) sticking upwardly and obliquely out of the passage, and a soldering pad (25) to be mounted on a circuit substrate (28).

5 Claims, 7 Drawing Sheets

ELECTRICAL CONNECTOR

BACKGROUND OF THE INVENTION

1. Field of the Invention

The present invention generally relates to the field of electrical connectors. And more particularly, one embodiment of the present invention relates to an electrical connector embedded with conductive terminals having desirable impedance.

2. General Background

Electrical connectors are widely used in various computer systems for forming electrical connection between two separate electrical interfaces, such as an electronic component and a circuit substrate. An electrical connector basically includes an insulative housing defining a number of passages and a number of conductive terminals residing in corresponding passages, respectively. The conductive terminals each include a vertical base section, a spring arm projecting upwardly and obliquely from the base section to mate with a conductive element of the electronic component, and a soldering pad angled from a lower end of the base section and mountable on the circuit substrate.

The materials set forth in connection with this U.S. patent application describe an electrical connector and associated conductive terminals—see e.g., U.S. Pat. Nos. 6,652,329, 6,805,561, 6,887,114 and 6,830,471, which are all hereby incorporated by reference.

In order to achieve favorable transmission of signals, especially high speed signals, between the electronic component and the electrical connector, impedance of the conductive terminal should match with that of the conductive element of the electronic component. However, in above-mentioned designs, impedance of the conductive terminal lies on mechanical features of the conductive terminal, i.e. configuration of the base section and the spring arm. Impedance matching between the conductive terminal and the conductive element of the electronic component is difficult to obtain, which may possibly adversely affect signal-transmitting performance of the electrical connector.

Therefore, there is a heretofore unaddressed need in the industry to address the aforementioned deficiencies and inadequacies.

SUMMARY

According to an embodiment of the present invention, an electrical connector includes an insulative housing defining a number of passages and a number of conductive terminals residing in corresponding passages, respectively. The conductive terminals each include a base section, a bent section provided with a planar section parallel with the base section, a spring arm sticking upwardly and obliquely out of the passage and a soldering pad angled with respect to a lower end of the base section.

The embodiment of the present invention provides an electrical connector having conductive terminals with desirable impedance. The arrangement of parallel base section and planar section of the conductive terminal creates a capacitive effect during signal transmission, which may optimize impedance of the conductive terminal so as to match with that of a corresponding conductive element of an electronic component.

The present invention is illustrated by way of example and not limitation in the figures of the appended drawings, in which like references indicate identical elements, and in which:

DETAILED DESCRIPTION OF THE EMBODIMENTS

In the following description, for purpose of explanation, numerous details are set forth in order to provide a thorough understanding of the embodiments of the present invention. However, it will be apparent to one skilled in the art that these specific details are not required in order to practice the embodiments of the present invention.

The following description includes terms such as upper, lower, upwardly and the like, that are used for descriptive purpose only and are not to be construed as limiting. That is, these terms are terms that are relative only to a point of reference and are not meant to be interpreted as limitation but are instead, included in the following description to facilitate understanding of the various aspects of the present invention.

Referring to FIG. 1 to FIG. 4, an electrical connector 10 in accordance with a first embodiment of the present invention includes an insulative housing 15 defining a number of passages 18 therein and a number of conductive terminals 20 residing in the corresponding passages 18, respectively.

Figure 2:
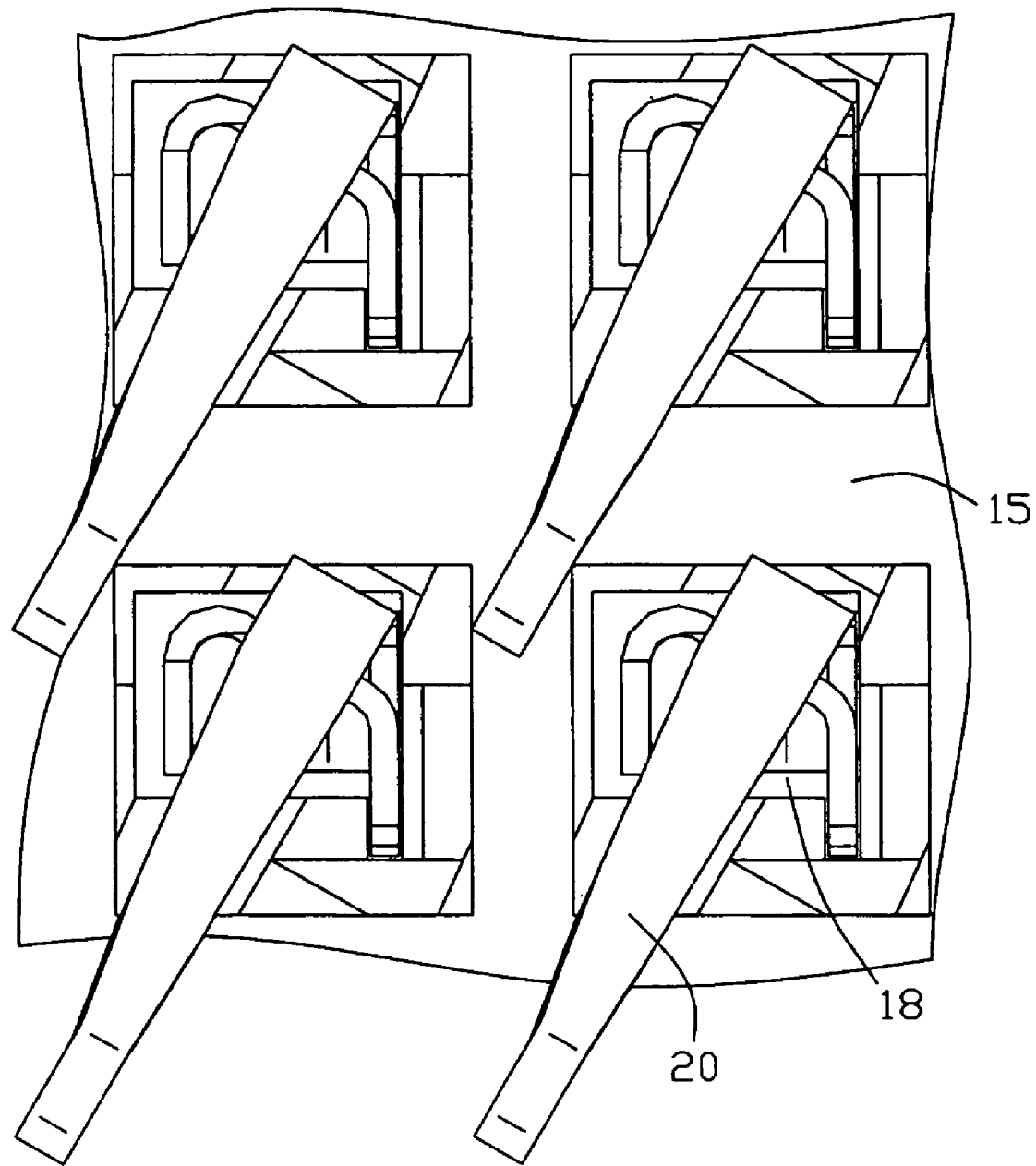
FIG. 2 depicts an exemplary planform view of an electrical connector planted with a number of conductive terminals of FIG. 1.
Figure 3:
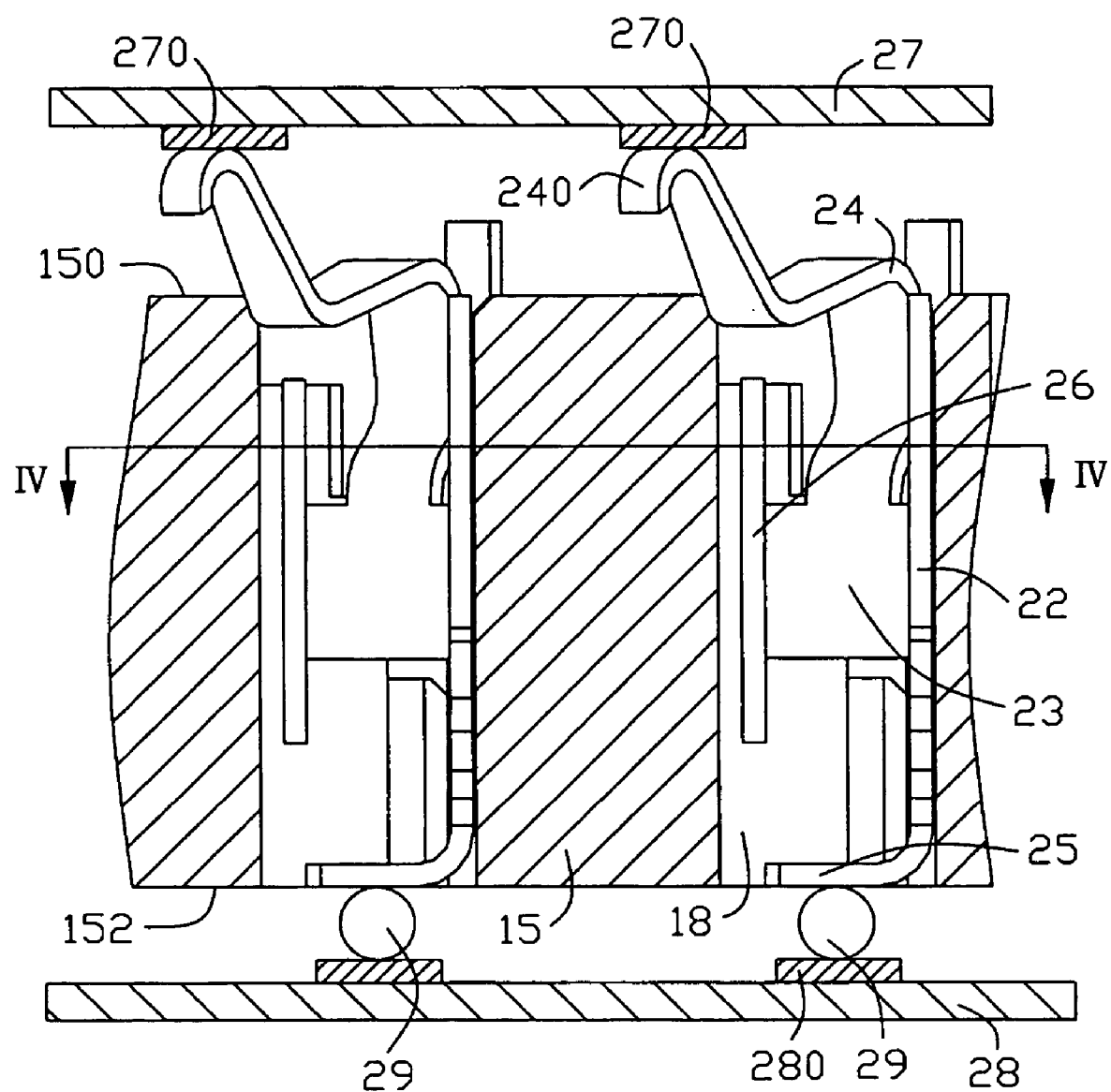
FIG. 3 depicts an exemplary cross-sectional view of the electrical connector of FIG. 2, showing the conductive terminal electrically mating with an electronic component and a circuit substrate at two ends thereof, respectively.
Figure 4:
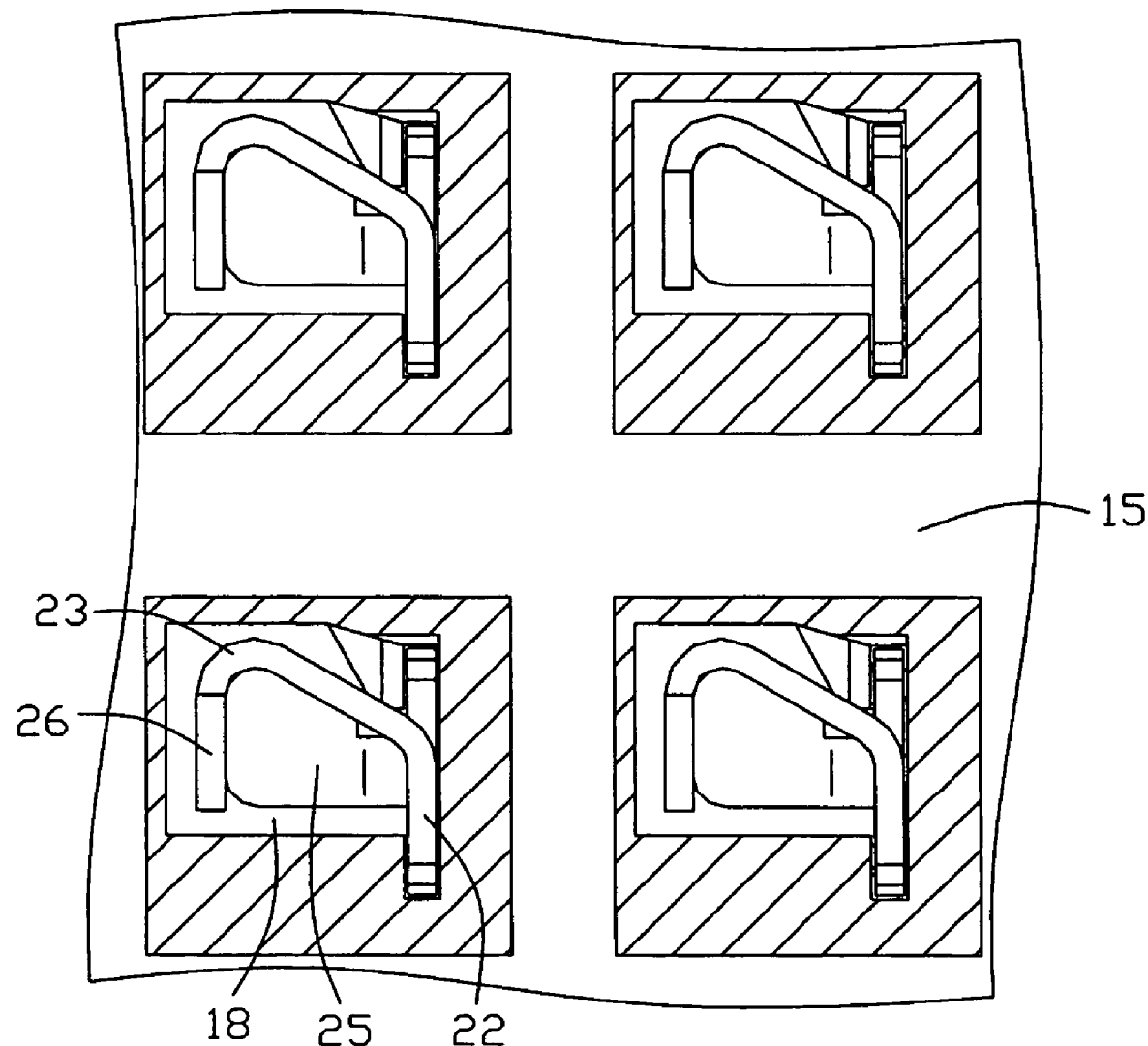
FIG. 4 depicts an exemplary cross-sectional view of the electrical connector of FIG. 3 taken along line IV-IV.

Individual elements of the electrical connector 10 will now be described in greater detail. As shown in FIG. 2 to FIG. 4, the housing 15 includes a supporting surface 150 to accept an electronic component 27, for example an integrated circuit package, thereon and an opposite facing mounting surface 152 to an electric substrate 28. A number of passages 18 extending between the supporting surface 150 and the mounting surface 152 are arranged in the housing 15 in a predetermined matrix fashion. Each passage defines a first sidewall, a second sidewall opposite to the first sidewall and two opposite third sidewalls connecting the first and the second sidewalls together.

Figure 1:
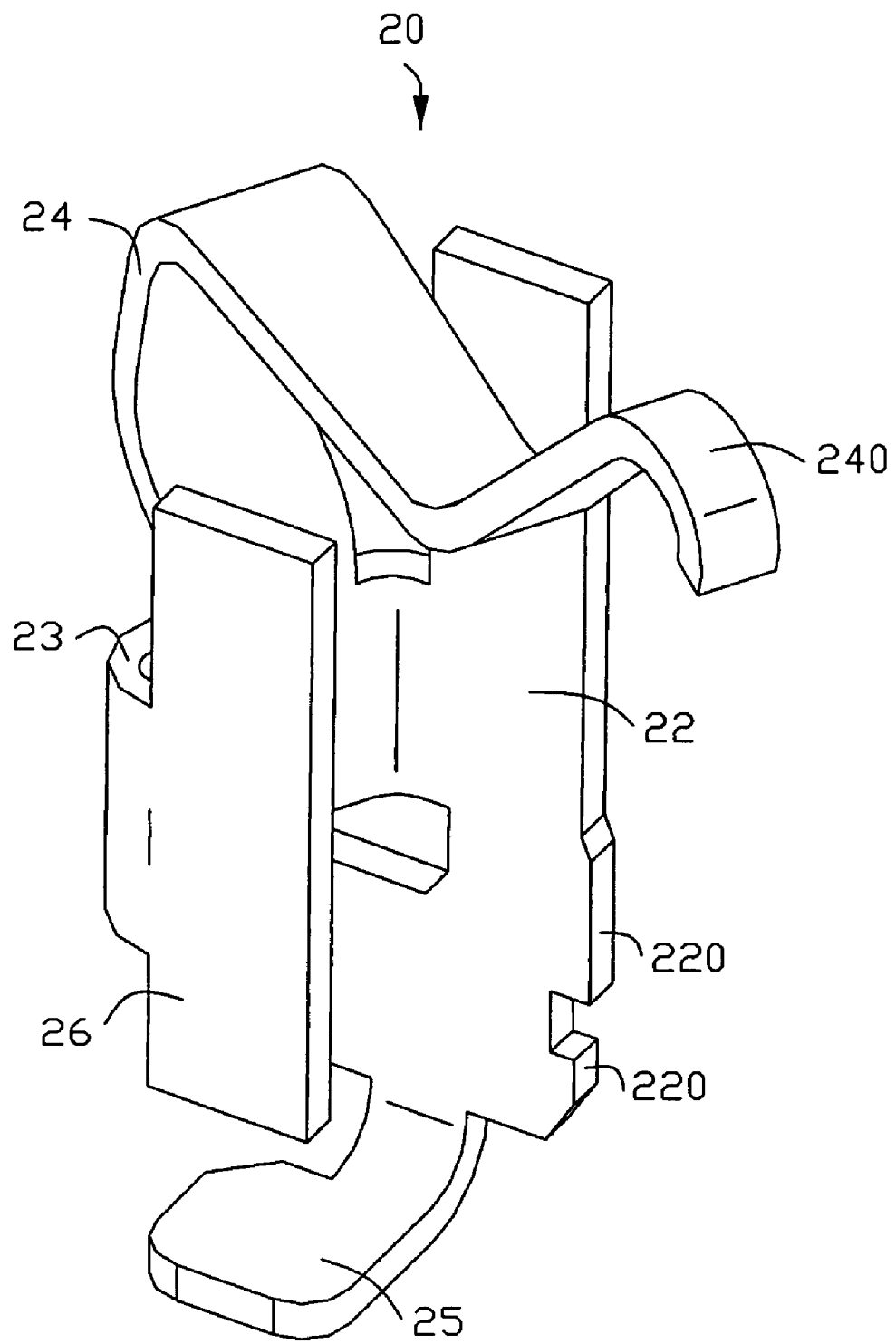
FIG. 1 depicts an exemplary isometric view of a conductive terminal according to a first embodiment of the present invention.

As shown in FIG. 1 and FIG. 2, a number of conductive terminals 20 made by stamping and bending are received in corresponding passages 18, respectively. Each conductive terminal 20 includes a vertically oriented base section 22 having a number of interfering blocks 220 at two lateral sides thereof, a bent section 23 projecting angularly from the base section 22, and a connecting section, for instance a soldering pad 25, to be mounted on a circuit substrate 28. A spring arm 24 projects upwardly and obliquely from the bent section 22 to mate with a conductive element 270 of an electronic component 27. The spring arm 24 is formed with a curved contacting section 240 at a free end thereof.

The bent section 23 is formed with a vertically oriented planar section 26 at a distal end thereof. The planar section 26 is substantially parallel with the base section 22 to define a space (not labeled) therebetween. During signal transmission, the space can create capacitive effect so as to adjust impedance of the conductive terminal 20. It should be understood that shape and size of the planar section 26 is alterable according to that of the base section 22 in order to change impedance of the conductive terminal 20.

As illustrated in FIG. 2 to FIG. 4, when the conductive terminal 20 is inserted in the passage 18, the base section 22 abuts against the first sidewall and the planar section 26 is arranged adjacent to the second sidewall. The spring arm 24 sticks upwardly and obliquely out of the passage 18, to mate with the conductive element 270 of the electronic component 27. The soldering pad 25 protrudes beyond the mounting surface 152 of the housing 15 to be connected to a corresponding soldering joint 280 on the electric substrate 28 via a soldering mass 29 attached thereto. The planar section 26 does not engage with the wall defining the passage 18.

Figure 5:
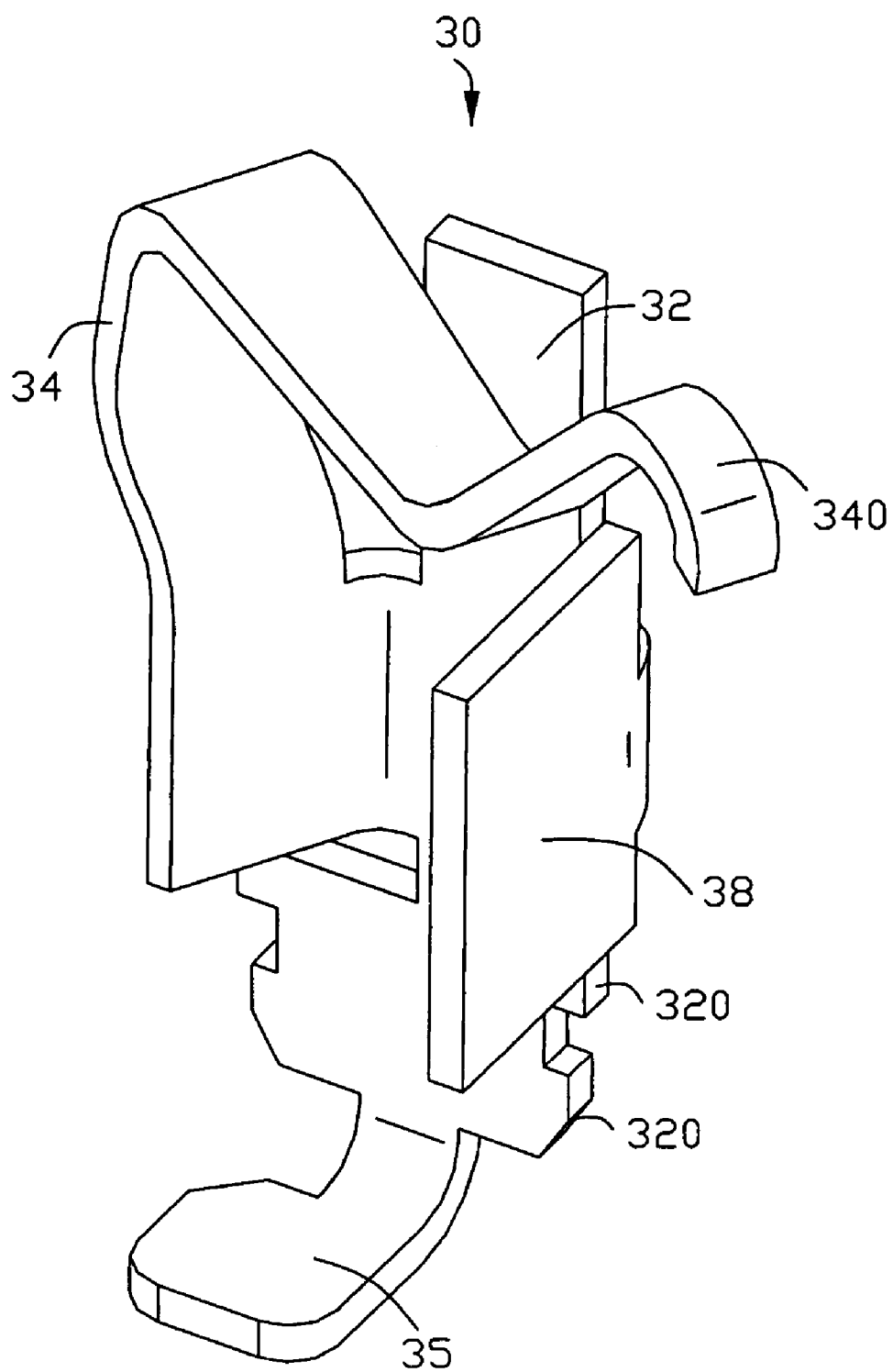
FIG. 5 depicts an exemplary isometric view of a conductive terminal according to a second embodiment of the present invention.

FIG. 5 illustrates a conductive terminal 30 for the electrical connector 10 in accordance with a second embodiment of the present invention. The conductive terminal 30 includes a vertical base section 32 having a number of interfering blocks 320 at two lateral sides thereof, a spring arm 34 having an arched contacting section 340 at a free end thereof and projecting upwardly and obliquely from one side of the base section 32, and a connecting section, for instance a soldering pad 35, to be mounted on the circuit substrate 28. A flat section 38 stretches out laterally and angularly from the base section 32. The flat section 38 is substantially opposite to at least part of the spring arm 340 to jointly enclose a chamber (not labeled) having capacity effect therebetween. Shape and size of the flat section 38 is alterable according to that of the base section 32. When the conductive terminal 30 is inserted in the passage 18, the base section 32 abuts against the first sidewall, and the flat section 38 and the spring arm 34 are arranged adjacent to the third sidewalls respectively.

Figure 6:
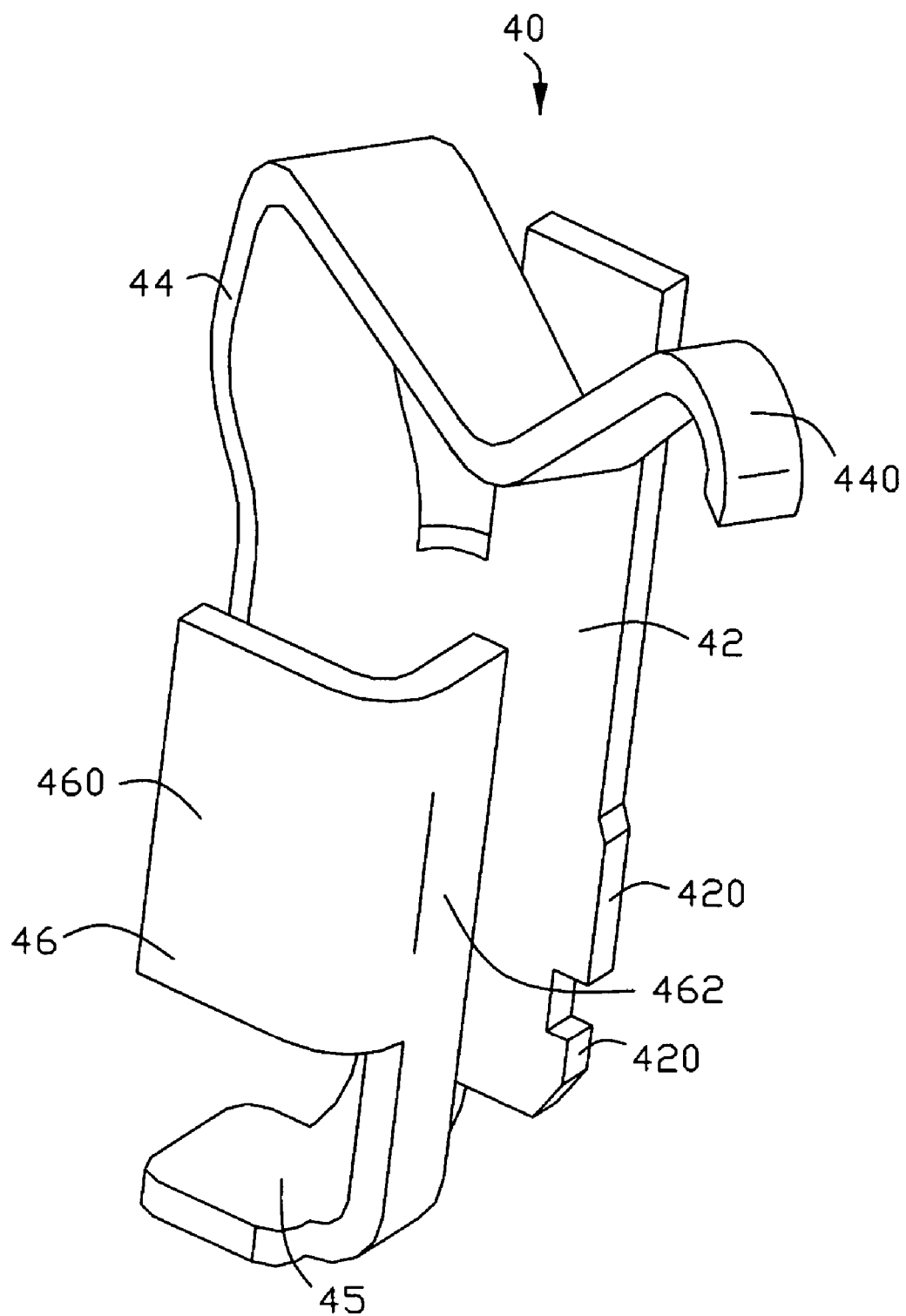
FIG. 6 depicts an exemplary isometric view of a conductive terminal according to a third embodiment of the present invention.

FIG. 6 illustrates a conductive terminal 40 for the electrical connector 10 in accordance with a third embodiment of the present invention. The conductive terminal 40 includes a vertically oriented base section 42 having a number of interfering blocks 420 at two sides thereof and secured in the passage 18. An upper mating section, for instance a spring arm 34 having an curved contacting section 440 at a free end thereof projects upwardly and obliquely from one side of the base section 42. A soldering pad 45 is set at a lower end of the base section 42 and angled with respect thereto. The soldering pad 45 is provided with an arched board section 46 rising upwardly from an edge thereof. The board section 46 includes two benders 460, 462 substantially opposite to the spring arm 44 and the base section 42, respectively. The base section 42, the spring arm 44 and the board section 46 cooperatively enclose a chamber (not labeled) having capacity effect during signal transmission. Shape and size of the board section 46 can be altered in accordance with that of the base section 42. When the conductive terminal 40 is inserted in the passage 18, the bend section 42 abuts against the first sidewall and the planar section 46 is arranged adjacent to the second sidewall.

Figure 7:
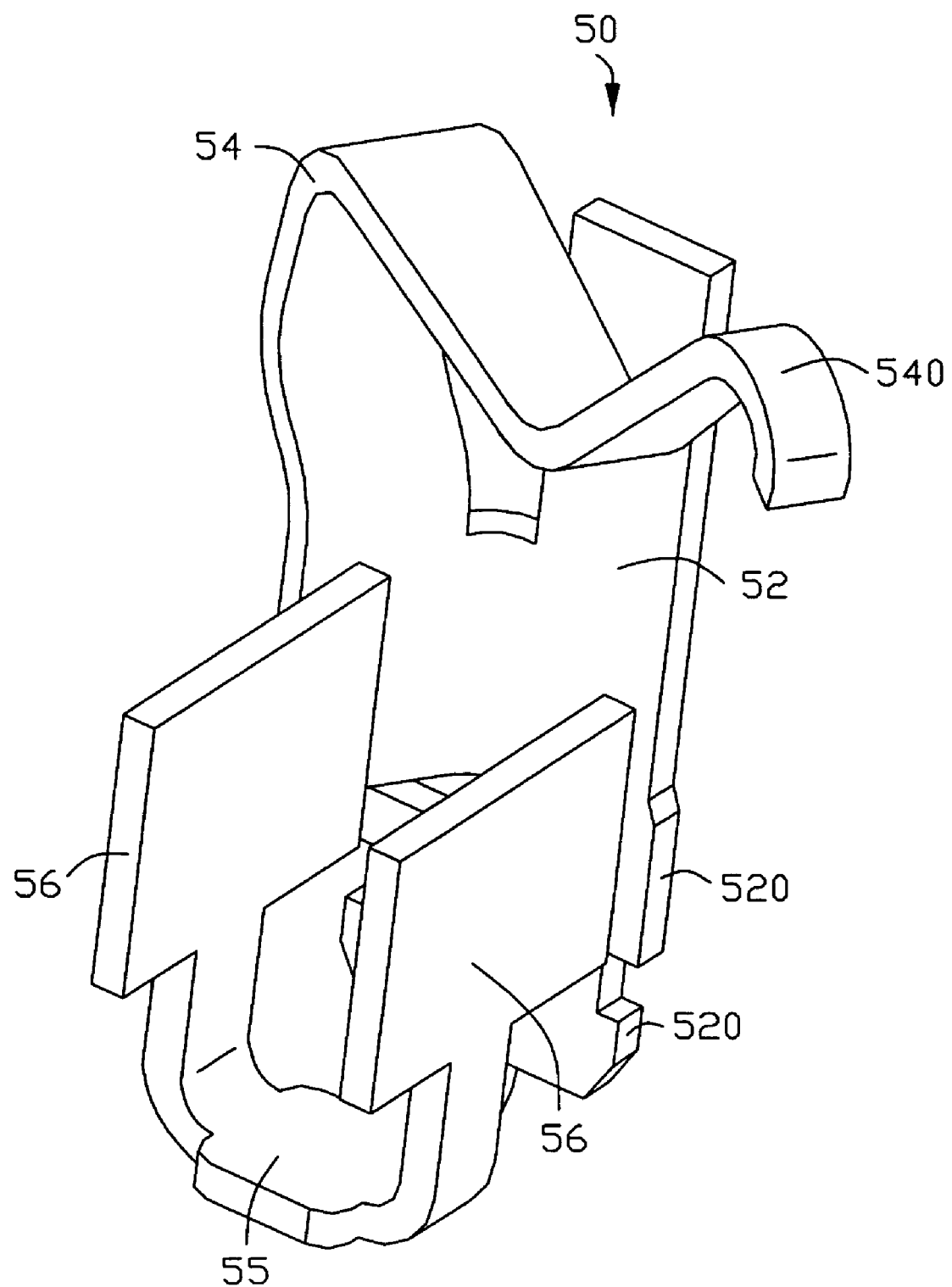
FIG. 7 depicts an exemplary isometric view of a conductive terminal according to a fourth embodiment of the present invention.

FIG. 7 illustrates a conductive terminal 50 for the electrical connector 10 in accordance with a fourth embodiment of the present invention. The conductive terminal 50 includes a vertically oriented base section 52 having a number of interfering blocks 520 at two sides thereof. An upper mating section, for instance a spring arm 54 having an curved contacting section 540 at a free end thereof projects upwardly and obliquely from one side of the base section 52. A soldering pad 55 angled relative to the base section 52 is disposed at a lower end thereof. The soldering pad 55 is provided with a pair of flat boards 56 parallel with one another rising upwardly from two opposite edges thereof. The two flat boards 56 define a chamber (not labeled) having capacity effect during signal transmission. When the conductive terminal 50 is inserted in the passage 18, the base section 52 abuts against the first sidewall. The two flat boards 56 are arranged adjacent to the third sidewalls respectively.

In connection with the preceding description, the electrical connector 10 in accordance with embodiments of the present invention can create capacitive effect during signal transmission, which possibly optimize impedance of the conductive terminals and may be able to reduce cross talk between two adjacent conductive terminals during signal transmission.

It should be noted that in prior designs, base section, soldering pad and spring arm of the conductive terminal not only need to meet mechanical performance, but also need to meet electrical performance. However, in the electrical connectors 10 in accordance with embodiments of the present invention, the planar section 26 or the flat section 36 or the board section 46 or the flat boards 56 of the conductive terminal do not engage with the wall of the passages 18. The planar section 26 or the flat section 36 or the board section 46 or the flat boards 56 is profiled to meet electrical performance of the conductive terminal additionally. Therefore, position, shape and size of the planar section 26 or the flat section 36 or the board section 46 or the flat boards 56 can be altered after mechanical performance of the conductive terminal is satisfied. In this manner, design of the conductive terminal is considerably facilitated.

In embodiments of the present invention, a land gird array connector 10 is used to disclose the concept of the present invention. However, it should be understood that the concept of the present invention could also be used by one ordinary skilled in the art to other types of connectors, such as ball grid array connectors and pin grid array connectors.

While the present invention has been illustrated by description of embodiments thereof, and while the embodiments have been described in considerable detail, it is not intended to restrict or in any way limit the scope of the appended claims to such details. Additional advantages and modifications in the spirit and scope of the present invention will readily appear to one skilled in the art. Therefore, the present invention is not limited to the specific details and illustrative examples shown and described.

What is claimed is:

1. An electrical connector comprising:
   an insulative housing defining a plurality of passages therein
   a plurality of conducts disposed in the corresponding passageways, respectively, each of said contacts defining:
   a base section;
   a spring arm located beside said base section and extending upwardly above the corresponding passageway; and
   a horizontal solder pad located beside said base section and proximate a bottom end of the corresponding passageway; and
   first and second vertical plates directly or indirectly extending from said base section and spaced from each other in a parallel relation under a condition that the first and second vertical plates directly face to each other without any portions of the housing interrupting therebetween for bringing about capacitance thereof, wherein said first vertical plate is formed on said base section, wherein said second vertical plate extend from a bent section which extends from the solder pad.

2. An electrical connector comprising:

an insulative housing defining a plurality of passages therein a plurality of conducts disposed in the corresponding passageways, respectively, each of said contacts defining:
- a base section;
- a spring arm located beside said base section and extending upwardly above the corresponding passageway; and
- a horizontal solder pad located beside said base section and proximate a bottom end of the corresponding passageway; and first and second vertical plates directly or indirectly extending from said base section and spaced from each other in a parallel relation under a condition that the first and second vertical plates directly face to each other without any portions of the housing interrupting therebetween for bringing about capacitance thereof, wherein both first and second vertical plates extend upwardly from the solder pad.

3. An electrical connector mountable on a circuit substrate, comprising:

an insulative housing having a plurality of passages arranged in a matrix fashion; and a plurality of conductive terminals disposed in corresponding passages, respectively, the conductive terminals each comprising:
- a base section;
- a spring arm and a flat section stretching out from two sides of the base section, the flat section being directly opposite to part of the spring arm without any portions of the housing therebetween so as to jointly enclose an effective chamber having capacitive effect therebetween; and
- a connecting section at a lower end of the base section for being electrically mounted to the circuit substrate.

4. The electrical connector of claim 3, wherein shape and size of the flat section of the conductive terminal is predetermined according to that of the base section.

5. The electrical connector of claim 3, wherein the flat section of the conductive terminal is spaced apart from the wall of the passage.

* * * * *